(12) United States Patent
Wellig et al.

(10) Patent No.: US 7,370,246 B2
(45) Date of Patent: May 6, 2008

(54) METHOD AND DEVICE OF DE-INTERLEAVING SUCCESSIVE SEQUENCES OF INTERLEAVED DATA SAMPLES

(75) Inventors: Armin Wellig, Nyon (CH); Julien Zory, Fernay Voltaire (FR)

(73) Assignee: STMicroelectronics N.V., Amsterdam (NL)

( * ) Notice: Subject to any disclaimer, the term of this patent is extended or adjusted under 35 U.S.C. 154(b) by 365 days.

(21) Appl. No.: 11/007,785

(22) Filed: Dec. 8, 2004

(65) Prior Publication Data

US 2005/0160342 A1   Jul. 21, 2005

(30) Foreign Application Priority Data

Dec. 9, 2003   (EP)   ................................. 03293074

(51) Int. Cl.
*H03M 13/03*   (2006.01)
*G06F 11/00*   (2006.01)

(52) U.S. Cl. ........................ 714/701; 714/787; 714/788

(58) Field of Classification Search ................ 714/701, 714/787, 788
See application file for complete search history.

(56) References Cited

U.S. PATENT DOCUMENTS

| 5,572,532 | A |   | 11/1996 | Fimoff et al. ................... 37/22 |
| 5,623,459 | A | * | 4/1997 | Iwamura et al. ............ 369/126 |
| 5,659,578 | A | * | 8/1997 | Alamouti et al. ............ 375/261 |
| 5,978,883 | A |   | 11/1999 | Hanna ........................... 711/5 |
| 6,061,820 | A | * | 5/2000 | Nakakita et al. ............ 714/751 |
| 6,603,412 | B2 | * | 8/2003 | Gatherer et al. .............. 341/61 |
| 2003/0101196 | A1 |   | 5/2003 | Woodard .................... 707/102 |

FOREIGN PATENT DOCUMENTS

| EP | 0660558 | 6/1995 |
| WO | 00/62461 | 10/2000 |

\* cited by examiner

*Primary Examiner*—Joseph D. Torres
(74) *Attorney, Agent, or Firm*—Lisa K. Jorgenson; Allen, Dyer, Doppelt, Milbrath & Gilchrist, P.A.

(57) ABSTRACT

Successive sequences of interleaved data samples extracted from a virtual memory having L0 columns and C0 rows are de-interleaved. The de-interleaving includes receiving each sequence of the interleaved data samples, and writing row by row the received sequences of interleaved data samples in a de-interleaving memory array having L rows and C columns, with L being greater or equal to L0 and C being greater or equal to C0. The data samples stored in the de-interleaving memory array are de-interleaved sub-array by sub-array. Each sub-array is a square cluster array having a number SQ of rows and columns. A cluster array is a row of the square cluster array comprising SQ data samples, with the number L of rows and the number C of columns of the de-interleaving memory array being multiples of the number SQ of rows and columns.

27 Claims, 3 Drawing Sheets

METHOD AND DEVICE OF DE-INTERLEAVING SUCCESSIVE SEQUENCES OF INTERLEAVED DATA SAMPLES

FIELD OF THE INVENTION

The invention relates in general to de-interleaving successive sequences of interleaved data samples, and in particular, for high-throughput applications. An application of the invention is in the field of wireless communication systems, and more particularly, to CDMA systems such as the different CDMA based mobile radio systems including 3GPP systems.

BACKGROUND OF THE INVENTION

Introduced in 1993, turbo-codes are part of current communication standards due to their outstanding forward error correction performance. Turbo-codes include concatenated component codes that work on the same block of information bits, separated by interleavers.

Interleaving scrambles the processing order to break up neighbor relations in successive data samples, and de-interleaving brings them into the original sequences again. Current de-interleaving approaches present several problems, notably a high memory access rate, a memory re-use bottleneck, and no scalability. Indeed, with current approaches, when high-throughput data is transmitted, an adaptation buffer is used, and its size increases as the throughput increases, and with the memory access rate remaining equal.

SUMMARY OF THE INVENTION

An object of the present invention is to enable high-throughput applications.

This and other objects, advantages and features in accordance with the present invention are provided by a method of de-interleaving successive sequences of interleaved data samples extracted from a virtual memory array having L0 columns and C0 rows. The method comprises the steps of receiving each sequence of the interleaved data samples and writing row by row the received sequences of interleaved data samples in a de-interleaving memory array having L rows and C columns, with L being greater or equal to L0 and C being greater or equal to C0.

The method may further comprise de-interleaving the data samples stored in the de-interleaving memory array sub-array by sub-array. The predetermined sub-array used may be a square cluster array having a predetermined number SQ of rows and columns. A cluster array is a row of the square cluster array comprising SQ data samples, with the number L of rows and the number C of columns of the de-interleaving memory array being multiples of the number SQ of rows and columns.

The square cluster array may be a virtual square cluster array. De-interleaving the de-interleaving memory array sub-array by sub-array allows avoidance of memory re-use bottlenecks, which decreases memory access rate.

In a preferred embodiment, if L0 and C0 are not multiples of SQ, then the writing step may comprise a step of completing the de-interleaving memory with padding data to have L rows and C columns, with L and C being multiples of SQ.

The method may require a square cluster array, so the method may further comprise a complete de-interleaving of the memory array with padding data. In one embodiment, the square cluster array comprises consecutive or non-consecutive clusters along rows of the de-interleaving memory array. The virtual square cluster array may be used to select SQ clusters, with each cluster containing SQ data samples, to perform sub-array de-interleaving.

Indeed, data samples have been interleaved in an interleaver having C0 rows and L0 columns. Data samples may be read column by column in an interleaving memory array, with a permutation in the columns order and with a permutation that could be the identity permutation.

In a preferred embodiment, the sub-array de-interleaving step may comprise for a first group of clusters of the current cluster array, reading each cluster of the first group, outputting the first data sample of the cluster, and reordering the other data samples of the cluster in a column of a reordering buffer. The data samples de-interleaved in the reordering buffer may be written back into the de-interleaving memory at the last SQ-1 accessed clusters. The method may further comprise for a second group of previously reordered clusters, reading each cluster of the second group and outputting all the data samples of the cluster.

A previously reordered cluster may contain simply the de-interleaved data samples previously reordered in the reordering buffer, and written back to the de-interleaving memory during the first phase referred to as processing with reordering.

In another embodiment, the square cluster array de-interleaving comprises cyclically, C/SQ times, L/SQ consecutive processing with reordering of clusters, and L-L/SQ consecutive processing without reordering of clusters. In a preferred embodiment, the reordering buffer has SQ-1 rows and SQ columns.

In another embodiment, a look-up table having three lines and a number of columns equal to C×L/SQ is used. The look-up table may contain the logical addresses of some of the samples of the current sequence, and the corresponding physical addresses in the de-interleaving memory array.

In a preferred embodiment, the first row of the look-up table may store the logical addresses of the data samples of interleaved data samples of the current sequence stored in the columns of the de-interleaving memory array indexed $p(i)+k \times SQ$, where $p(i)$ specifies the inter-columns permutation, with i varying from 0 to L/SQ-1, and k varying from 0 to C/SQ-1. The second row of the look-up table may store physical addresses of the respective logical addresses of the first row, and the third row of the look-up table may store physical addresses of data samples of the next sequence of interleaved data samples to be written in the de-interleaving memory array, having the respective logical addresses of the first row.

In another embodiment, the square cluster array de-interleaving step may further comprise, after having processed a previous cluster, selecting in the square cluster array, the next cluster having a first data sample having a logical address immediately following the logical address of the last data sample of the previous cluster.

According to the invention, a de-interleaved device of successive sequences of interleaved data samples for a receiving system is also proposed, with interleaved data samples being extracted from a virtual memory array having L0 columns and C0 rows. The de-interleaving device may comprise a de-interleaving memory array, and receiving means for receiving each sequence of the interleaved data samples, and writing means for writing row by row the received sequences of interleaved data samples in the de-interleaving memory array having L rows and C columns.

A cluster array is a row of the square cluster array comprising SQ data samples, with L being greater or equal to L0 and C being greater or equal to C0. The de-interleaving device may also comprise de-interleaving means for de-interleaving the data samples stored in the de-interleaving memory array sub-array by sub-array. The used predetermined sub-array may be a square cluster array having a predetermined number SQ of rows and columns. The number L of rows and the number C of columns of the de-interleaving memory array are multiples of the number SQ of rows and columns. Of course, the square cluster array is a virtual square cluster array.

In a preferred embodiment, the de-interleaving means may comprise completing means for completing, if L0 and C0 are not multiples of SQ, the de-interleaving memory array with padding data to have L rows and C columns multiples of SQ. In another embodiment, the de-interleaving means device may comprise means for defining the square cluster array comprising consecutive or non-consecutive clusters.

In yet another embodiment, the de-interleaving device may comprise a reordering buffer. The de-interleaving means may further comprise first means for reading each cluster of a first group of clusters of the current cluster array, outputting the first data sample of the cluster, and reordering the other data samples of the cluster in a column of the reordering buffer. The first means may write its content back at the SQ-1 last accessed clusters into the de-interleaving memory. The device may further comprise second means for reading each cluster of a second group of clusters of the current cluster array, and outputting the cluster. The reordering buffer may comprise SQ-1 rows and SQ columns.

In one embodiment, the de-interleaving device comprises a look-up table comprising three rows and a number of columns equal to C×L/SQ. The look-up table may contain the logical addresses of some of the data samples of the current sequence and the corresponding physical addresses in the de-interleaving memory array.

In one embodiment, the de-interleaving means may comprise first storing means for storing, in the first row of the look-up table, the logical addresses of the data samples of interleaved data samples of the current sequence stored in the columns of the de-interleaving memory array indexed p(i)+k×SQ, where p(i) specifies the inter-columns permutation, with i varying from 0 to L/SQ-1, and k varying from 0 to C/SQ-1.

The de-interleaving means may further comprise second storing means for storing, in the second row of the look-up table, physical addresses of the respective logical addresses of the first row, and third storing means. The third storing means stores, in the third row of the look-up table, physical addresses of data samples of the next sequence of interleaved data samples to be written in the de-interleaving memory array, and having the respective logical addresses of the first row.

In a preferred embodiment, the de-interleaving means may comprise selecting means for selecting, after having processed a previous cluster, in the square cluster array, the next cluster having a first data sample having a logical address immediately following the logical address of the last data sample of the previous cluster.

According to another aspect of the present invention, a receiving apparatus, such as a cellular mobile phone, incorporates a de-interleaving device as above defined.

BRIEF DESCRIPTION OF THE DRAWINGS

Other advantages and features of the invention will appear on examining the detailed description of embodiments, these being in no way limiting, and of the appended drawings in which.

DETAILED DESCRIPTION OF THE PREFERRED EMBODIMENTS

Figure 1:
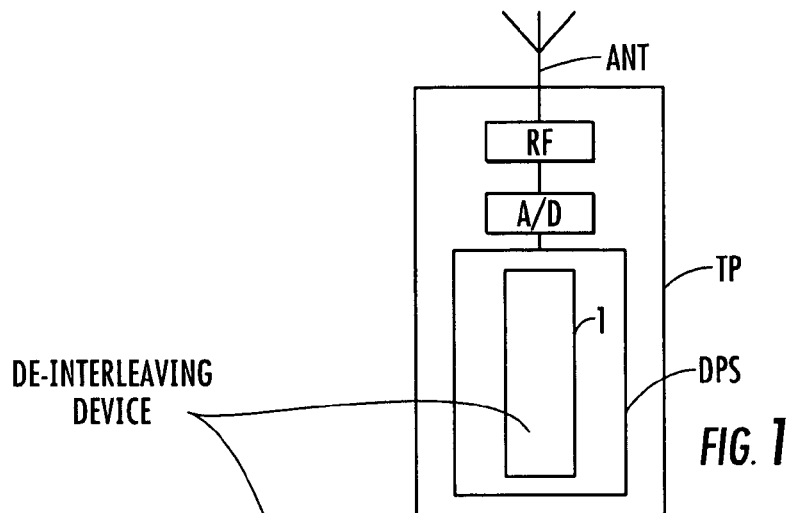
FIG. 1 is a block diagram of a cellular mobile phone including a de-interleaving device according to the invention.

Referring now to FIG. 1, a de-interleaving device according to the invention is illustrated, which is incorporated in the reception chain of a cellular mobile phone TP. However, the invention is not limited to this particular application.

The interleaved signal is received by the antenna ANT and processed by the radio frequency stage RF of the receiver. At the output of the RF stage, the signal is converted into the digital domain by an A/D converter. The converted signal is transmitted to a digital process stage DPS which comprises a de-interleaving device according to the invention, and is part of a processing chain which processes the digital base band signal.

Figure 2:
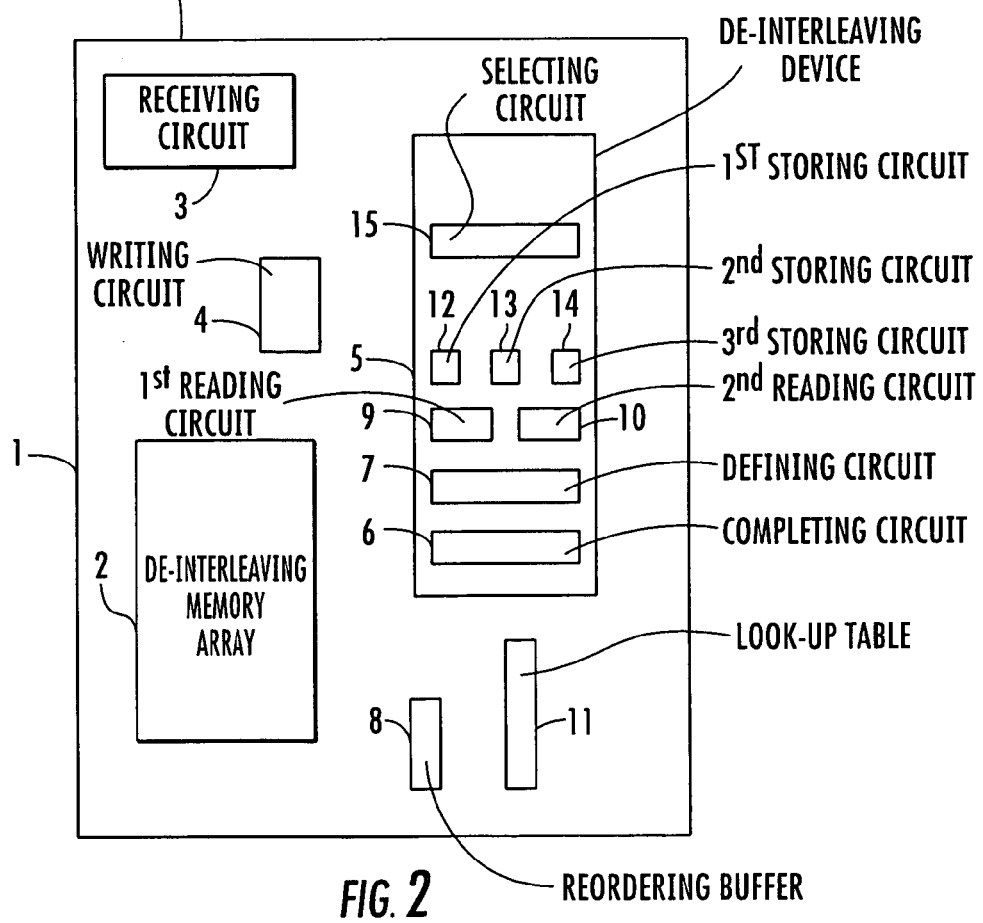
FIG. 2 is a block diagram of the de-interleaving device shown in FIG. 1.

Referring now to FIG. 2, a de-interleaving device 1 for a receiving system according to the invention is illustrated. The de-interleaving device 1 comprises a de-interleaving memory 2, which can be organized as an array.

Successive sequences of interleaved data samples are received by receiving means 3, and written row by row in the de-interleaving memory array 2 by writing means 4. The written row by row in the de-interleaving memory array 2 is done cluster by cluster, i.e., each time a cluster is output a new cluster can be written to the empty de-interleaving memory location thereby enabling continuous memory-reuse. Of course, the de-interleaving memory array 2 has L rows and C columns, where L is greater or equal to L0 and C is greater or equal to C0, with C0 and L0 being respectively the number of rows and the number of columns of a virtual memory array from which interleaved data samples are extracted after interleaving. The extraction of data samples is done column by column in the interleaving memory array with a possible permutation of the columns order.

De-interleaving means 5 allow de-interleaving in the de-interleaving memory array 2 sub-array by sub-array. The used predetermined sub-array is a square cluster array having a number SQ of rows and columns. A cluster is a row of the square cluster array, containing SQ data samples. Of course, the square cluster array is virtual, it groups SQ clusters, where the logical address of the first data sample in each cluster follows a chronological order that need to be considered during one reordering step.

De-interleaving means 5 comprise completing means 6 for completing the de-interleaving memory array 2 with padding data to have L rows and C columns multiples of SQ, if L0 and C0 are not multiples of SQ. Padding data will be eliminated afterwards.

De-interleaving means 5 also comprise means 7 for defining the square cluster array comprising consecutive or non-consecutive clusters, along rows of the de-interleaving memory array 2. A cluster array comprising SQ clusters of data samples is stored in SQ consecutive columns of the de-interleaving memory array 2.

The de-interleaving device 1 further comprises a reordering buffer 8 comprising SQ-1 rows and SQ columns, and the de-interleaving means 5 comprise first means 9 for reading each cluster of a first group of clusters of the current cluster array, outputting the first value of the cluster, and reordering the other values of the cluster in a column of the reordering buffer 8. The de-interleaving means 5 further comprise second means 10 for reading each cluster of a second group of clusters of the current cluster array and outputting the cluster.

The de-interleaving device 1 also comprises a look-up table 11 comprising three rows and a number of columns equal to C×L/SQ. This look-up table 11 contains the logical addresses of some of the samples of the current sequence, where those samples simply represent the first data sample of a given cluster, and the corresponding physical addresses in the de-interleaving memory array 2.

The de-interleaving memory array 2 further comprises first storing means 12 for storing, in the first row of the look-up table 11, the logical addresses of the samples of interleaved data samples of the current sequence stored in the columns of the de-interleaving memory array 2 indexed p(i)+k×SQ, where p(i) specifies the inter-columns permutation table and defines the original column position of the $i^{th}$ permuted column in the interleaver, with i varying from 0 to L/SQ-1, and with k varying from 0 to C/SQ-1. The de-interleaving memory array 2 also comprises second storing means 13 for storing, in the second row of the look-up table 11, physical addresses of the respective logical addresses of the first row, and third storing means 14 for storing, in the third row of the look-up table 11, physical addresses of samples of the next sequence of interleaved data samples to be written in the de-interleaving memory array 2, having the respective logical addresses of the first row.

At last, the de-interleaving means 5 comprise selecting means 15 for selecting, after having processed a previous cluster, in the square cluster array, the next cluster having a first data sample having a logical address immediately following the logical address of the last sample of said previous cluster.

Figure 3:
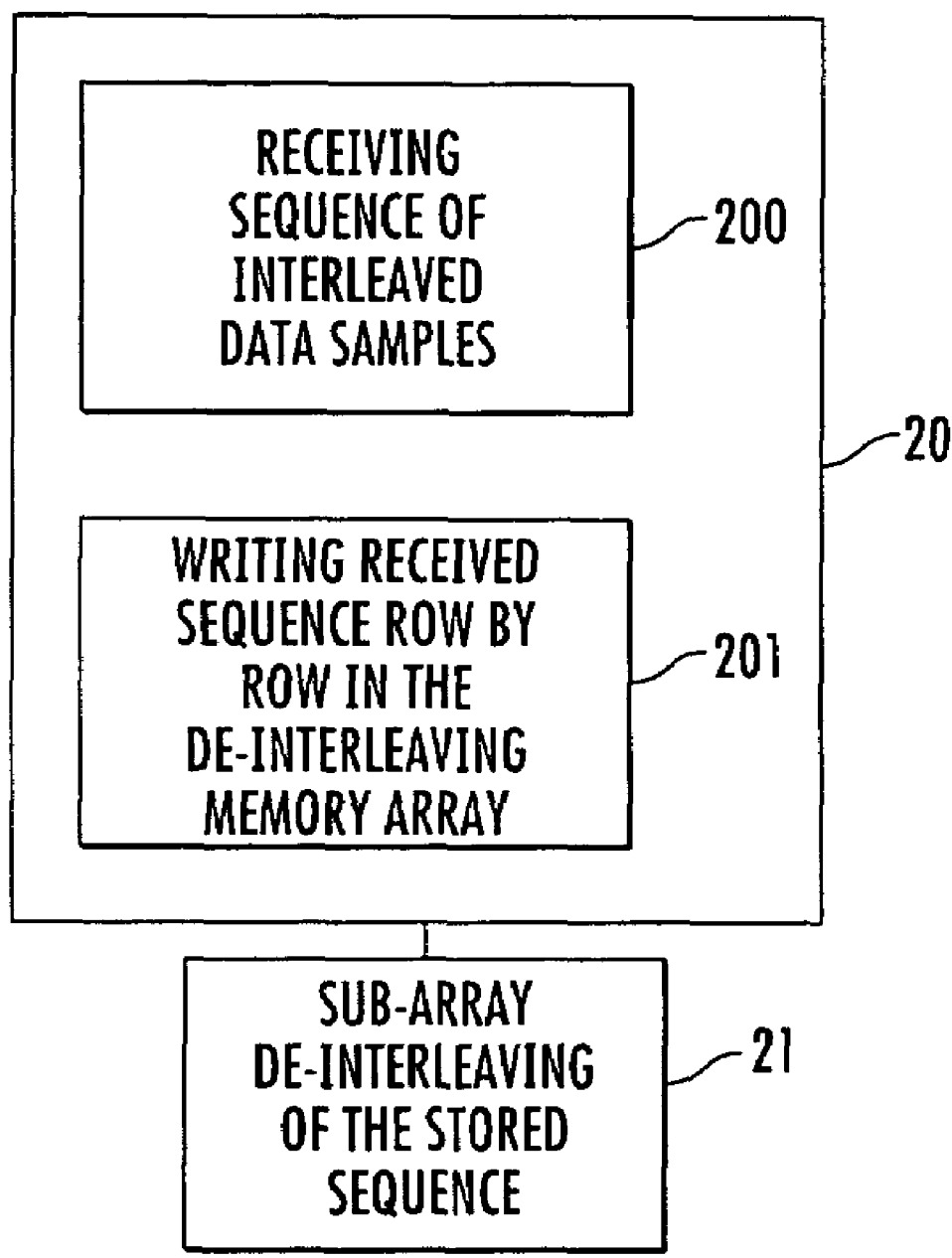
FIG. 3 illustrates the main steps for de-interleaving according to the invention.

FIG. 3 illustrates an example of a method of de-interleaving successive sequences of interleaved data samples extracted from a virtual memory array having L0 columns and C0 rows. The method comprises first (step 20, FIG. 3) receiving (step 200, FIG. 3) each sequence of the interleaved data samples and writing (step 201, FIG. 3) row by row the received sequences of interleaved data samples in the de-interleaving memory array 2 having L rows and C columns, with L being greater or equal to L0 and C being greater or equal to C0.

The data samples are then stored in the de-interleaving memory array 2 are de-interleaved (step 21, FIG. 3) sub-array by sub-array. The used predetermined sub-array is a square cluster array having a predetermined number SQ of rows and of columns. A cluster is a row of the square cluster array which comprises SQ data samples. The number L of rows and the number C of columns of the de-interleaving memory array 2 are multiples of the number SQ of rows and columns.

Furthermore, if L0 and C0 are not multiples of SQ, then the writing step (step 201, FIG. 3) comprises a step of completing the de-interleaving memory array (2) with padding data to have L rows and C columns multiples of SQ.

Figure 4:
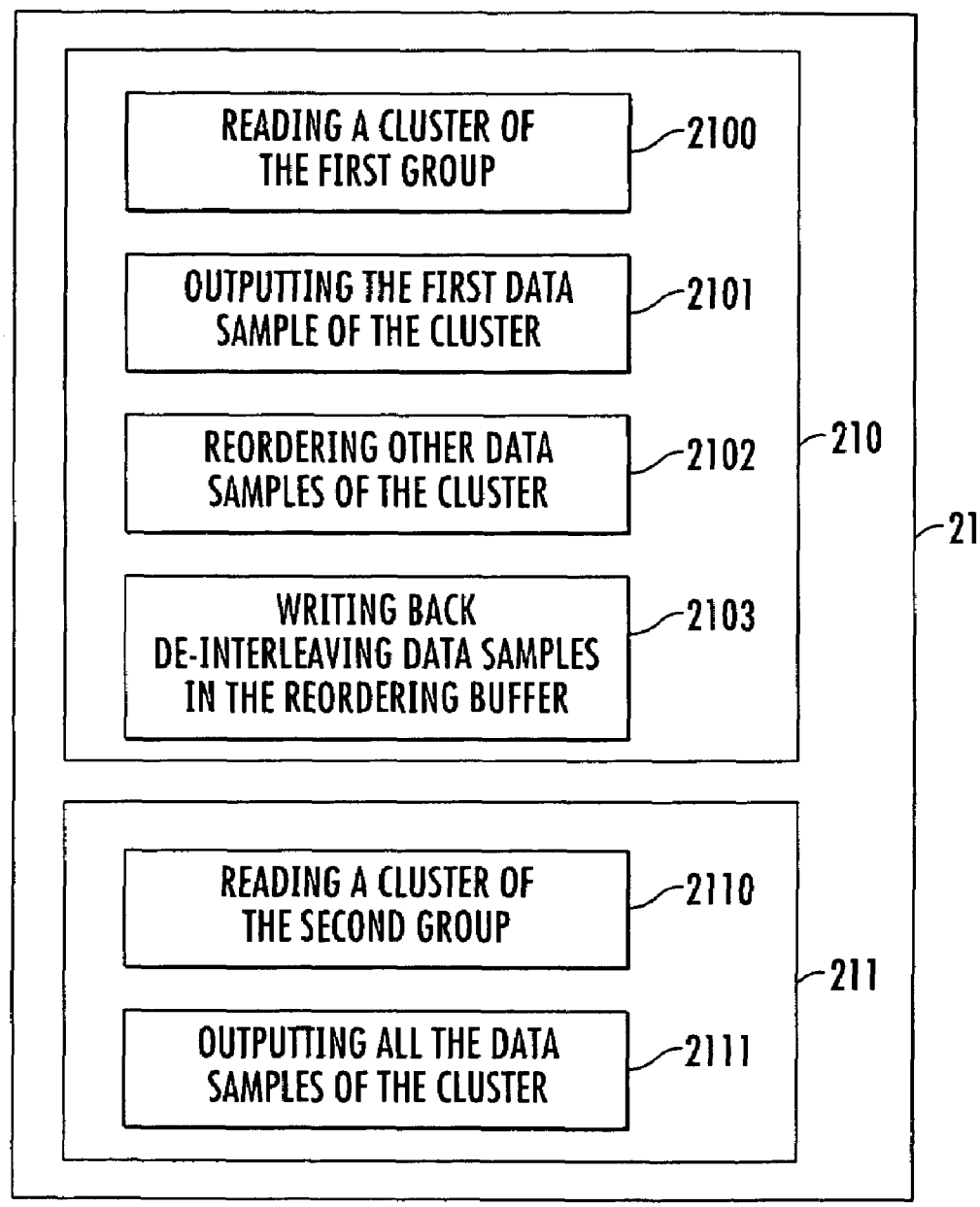
FIG. 4 illustrates sub-array de-interleaving for the de-interleaving steps shown in FIG. 3.

FIG. 4 illustrates an example embodiment of the sub-array by sub-array de-interleaving step 21 from FIG. 3. First (step 210, FIG. 4), for a first group of clusters of the current cluster array, each cluster of the first group is read (step 2100, FIG. 4). The first value of the cluster is output (step 2101, FIG. 4), and the other values of the cluster are reordered (step 2102, FIG. 4) in a column of the reordering buffer 8. The data samples de-interleaved are written back (step 2103, FIG. 4) in the reordering buffer 8 into the de-interleaving memory at the last SQ-1 accessed clusters.

Then (step 211, FIG. 4), for a second group of previously reordered clusters, each cluster of the second group is read (step 2110, FIG. 4) and all the data samples of the cluster are output (step 2111, FIG. 4).

Now, the method according to the invention will be described with an example. In this example, the number L of rows and the number C of columns of the de-interleaving memory 2 are multiples of the number SQ of rows and columns of the square cluster array. More particularly, in this example, L=L0=6, C=C0=9, and SQ=3.

The interleaved memory array has C0=9 rows and L0=6 columns. It contains the data samples having the logical addresses represented in:

| 0 | 1 | 2 | 3 | 4 | 5 |
|---|---|---|---|---|---|
| 6 | 7 | 8 | 9 | 10 | 11 |
| 12 | 13 | 14 | 15 | 16 | 17 |
| 18 | 19 | 20 | 21 | 22 | 23 |
| 24 | 25 | 26 | 27 | 28 | 29 |
| 30 | 31 | 32 | 33 | 34 | 35 |
| 36 | 37 | 38 | 39 | 40 | 41 |
| 42 | 43 | 44 | 45 | 46 | 47 |
| 48 | 49 | 50 | 51 | 52 | 53 |

A sequence with data samples having logical addresses ordered from 0 to 53 has been written in the interleaving memory array row by row. The interleaving memory array is read column by column, with the identical permutation in this example, so the sequence of logical addresses of data samples read on its output is: 0, 6, 12, 18, 24, 30, 36, 42, 48, 1, 7, 13, 19, 25, 31, 37, 43, 49, 2, 8, 7, 14, 20, 26, 32, 38, 44, 50, 3, 9, 15, 21, 27, 33, 39, 45, 51, 4, 10, 16, 22, 28, 34, 40, 46, 52, 5, 11, 17, 23, 29, 35, 41, 47, 53. This sequence is stored row by row in the de-interleaving memory array, so the de-interleaving memory array 2 contains the data samples having the logical addresses represented in:

de-interleaving memory array 2:

| 0 | 6 | 12 | 18 | 24 | 30 | 36 | 42 | 48 |
|---|---|---|---|---|---|---|---|---|
| 1 | 7 | 13 | 19 | 25 | 31 | 37 | 43 | 49 |
| 2 | 8 | 14 | 20 | 26 | 32 | 38 | 44 | 50 |
| 3 | 9 | 15 | 21 | 27 | 33 | 39 | 45 | 51 |
| 4 | 10 | 16 | 22 | 28 | 34 | 40 | 46 | 52 |
| 5 | 11 | 17 | 23 | 29 | 35 | 41 | 47 | 53 |

So, the look-up table 11 contains:

| Log. Ad | 0 | 1 | 2 | 3 | 4 | 5 | 18 | 19 | 20 |
|---|---|---|---|---|---|---|---|---|---|
| Read | 0, 0 | 1, 0 | 2, 0 | 3, 0 | 4, 0 | 5, 0 | 0, 3 | 1, 3 | 2, 3 |
| Write | | | | | | | | | |

| 21 | 22 | 23 | 36 | 37 | 38 | 39 | 40 | 41 |
|---|---|---|---|---|---|---|---|---|
| 3, 3 | 4, 3 | 5, 3 | 0, 6 | 1, 6 | 2, 6 | 3, 6 | 4, 6 | 5, 6 |
| | | | | | | | | |

In the first row are the logical addresses of the first data samples in a given cluster, where one cluster contains SQ data samples, and in the second row, the corresponding physical address in the de-interleaving memory array 2. These physical addresses are addresses for reading data samples in the de-interleaving memory array 2. The rows are numbered from 0 to L-1 and columns are numbered from 0 to C-1. In this example L=L0 and C=C0. The size SQ×SQ of the square cluster array is 3×3, as represented above on the de-interleaving memory array 2.

The method begins with consideration of the first cluster array, and more particularly, the first cluster of the cluster array, as known, the cluster with the first data sample having the smallest logical address, here 0. This first data sample of the first cluster is output, and other data samples of the cluster are reordered in the reordering buffer 8, written in the first column of the reordering buffer 8. We have:

de-interleaving memory array 2:

| | | | 18 | 24 | 30 | 36 | 42 | 48 |
|---|---|---|---|---|---|---|---|---|
| 1 | 7 | 13 | 19 | 25 | 31 | 37 | 43 | 49 |
| 2 | 8 | 14 | 20 | 26 | 32 | 38 | 44 | 50 |
| 3 | 9 | 15 | 21 | 27 | 33 | 39 | 45 | 51 |
| 4 | 10 | 16 | 22 | 28 | 34 | 40 | 46 | 52 |
| 5 | 11 | 17 | 23 | 29 | 35 | 41 | 47 | 53 | output:
0 reordering buffer 8:

| 6 | | |
|---|---|---|
| 12 | | | and the look-up table 11:

| Log. Ad | 0 | 1 | 2 | 3 | 4 | 5 | 18 | 19 | 20 |
|---|---|---|---|---|---|---|---|---|---|
| Read | 0, 0 | 1, 0 | 2, 0 | 3, 0 | 4, 0 | 5, 0 | 0, 3 | 1, 3 | 2, 3 |
| Write | | | | | | | | | |

| 21 | 22 | 23 | 36 | 37 | 38 | 39 | 40 | 41 |
|---|---|---|---|---|---|---|---|---|
| 3, 3 | 4, 3 | 5, 3 | 0, 6 | 1, 6 | 2, 6 | 3, 6 | 4, 6 | 5, 6 |
| | | | | | | | | |

The physical address 0,0 corresponding to the cluster containing the data sample with the logical address 0 is highlighted in the look-up table 11 above.

Then the next data sample to be output, with the logical address immediately following the last output, is the data sample of the cluster of the current cluster array, with the first logical address being 1. This is given by the look-up table, as the physical corresponding address, here 1,0. The first data sample of this cluster, having the logical address immediately following the last output, is output, and other data samples of the cluster are reordered in the reordering buffer 8, written in the first column of the reordering buffer 8. We have:

de-interleaving memory array 2:

| | | | 18 | 24 | 30 | 36 | 42 | 48 |
|---|---|---|---|---|---|---|---|---|
| | | | 19 | 25 | 31 | 37 | 43 | 49 |
| 2 | 8 | 14 | 20 | 26 | 32 | 38 | 44 | 50 |
| 3 | 9 | 15 | 21 | 27 | 33 | 39 | 45 | 51 |
| 4 | 10 | 16 | 22 | 28 | 34 | 40 | 46 | 52 |
| 5 | 11 | 17 | 23 | 29 | 35 | 41 | 47 | 53 | output:

0    1 reordering buffer 8:

| 6 | 7 | |
|---|---|---|
| 12 | 13 | | and the look-up table 11:

| Log. Ad | 0 | 1 | 2 | 3 | 4 | 5 | 18 | 19 | 20 |
|---|---|---|---|---|---|---|---|---|---|
| Read | 0, 0 | 1, 0 | 2, 0 | 3, 0 | 4, 0 | 5, 0 | 0, 3 | 1, 3 | 2, 3 |
| Write | | | | | | | | | |

| 21 | 22 | 23 | 36 | 37 | 38 | 39 | 40 | 41 |
|---|---|---|---|---|---|---|---|---|
| 3, 3 | 4, 3 | 5, 3 | 0, 6 | 1, 6 | 2, 6 | 3, 6 | 4, 6 | 5, 6 |
| | | | | | | | | |

The physical address 1,0 corresponding to the cluster containing the data sample with the logical address 1 is highlighted in the look-up table 11 above.

Then the next data sample to be output, with the logical address immediately following the last output, is the data sample of the cluster of the current cluster array, with the first logical address being 2. This is given by the look-up table, as the physical corresponding address, here 2,0. The first data sample of this cluster, having the logical address immediately following the last output, is output, and other data samples of the cluster are reordered in the reordering buffer 8, written in the first column of the reordering buffer 8. We have the de-interleaving memory array 2 as follows:

|   |   |    | 18 | 24 | 30 | 36 | 42 | 48 |
|---|---|----|----|----|----|----|----|----|
|   |   |    | 19 | 25 | 31 | 37 | 43 | 49 |
|   |   |    | 20 | 26 | 32 | 38 | 44 | 50 |
| 3 | 9 | 15 | 21 | 27 | 33 | 39 | 45 | 51 |
| 4 | 10| 16 | 22 | 28 | 34 | 40 | 46 | 52 |
| 5 | 11| 17 | 23 | 29 | 35 | 41 | 47 | 53 | output: 0 1 2 and reordering buffer 8:

| 6  | 7  | 8  |
|----|----|----|
| 12 | 13 | 14 | and the look-up table 11:

| Log. Ad | 0   | 1   | 2   | 3   | 4   | 5   | 18  | 19  | 20  |
|---------|-----|-----|-----|-----|-----|-----|-----|-----|-----|
| Read    | 0,0 | 1,0 | 2,0 | 3,0 | 4,0 | 5,0 | 0,3 | 1,3 | 2,3 |
| Write   |     |     |     |     |     |     |     |     |     |

| 21  | 22  | 23  | 36  | 37  | 38  | 39  | 40  | 41  |
|-----|-----|-----|-----|-----|-----|-----|-----|-----|
| 3,3 | 4,3 | 5,3 | 0,6 | 1,6 | 2,6 | 3,6 | 4,6 | 5,6 |
|     |     |     |     |     |     |     |     |     |

The physical address 2,0 corresponding to the cluster containing the data sample with the logical address 2 is highlighted in the look-up table 11 above.

The reordering buffer 8 is full, so its content is written in the SQ-1=2 last rows or clusters processed of the current cluster array so that the de-interleaving memory array 2 is as follows:

|    |    |    | 18 | 24 | 30 | 36 | 42 | 48 |
|----|----|----|----|----|----|----|----|----|
| 6  | 7  | 8  | 19 | 25 | 31 | 37 | 43 | 49 |
| 12 | 13 | 14 | 20 | 26 | 32 | 38 | 44 | 50 |
| 3  | 9  | 15 | 21 | 27 | 33 | 39 | 45 | 51 |
| 4  | 10 | 16 | 22 | 28 | 34 | 40 | 46 | 52 |
| 5  | 11 | 17 | 23 | 29 | 35 | 41 | 47 | 53 | output: 0 1 2 and reordering buffer 8:

The addresses of the SQ-1=2 written reordered cluster are not stored, because with these predetermined parameters (L,C,SQ) their place is known. This has been the first step of reordering. Now a cluster is free in the de-interleaving memory array 2, and the SQ first data samples of the next sequence to be de-interleaved is stored in:

de-interleaving memory array 2:

| 0  | 6  | 12 | 18 | 24 | 30 | 36 | 42 | 48 |
|----|----|----|----|----|----|----|----|----|
| 6  | 7  | 8  | 19 | 25 | 31 | 37 | 43 | 49 |
| 12 | 13 | 14 | 20 | 26 | 32 | 38 | 44 | 50 |
| 3  | 9  | 15 | 21 | 27 | 33 | 39 | 45 | 51 |
| 4  | 10 | 16 | 22 | 28 | 34 | 40 | 46 | 52 |
| 5  | 11 | 17 | 23 | 29 | 35 | 41 | 47 | 53 | output:

0   1   2 reordering buffer 8:

So it is necessary to store in the look-up table the physical address of the first data sample of the cluster corresponding to these data of the next sequence:

look-up table 11:

| Log. Ad | 0   | 1   | 2   | 3   | 4   | 5   | 18  | 19  | 20  |
|---------|-----|-----|-----|-----|-----|-----|-----|-----|-----|
| Read    | 0,0 | 1,0 | 2,0 | 3,0 | 4,0 | 5,0 | 0,3 | 1,3 | 2,3 |
| Write   | 0,0 |     |     |     |     |     |     |     |     |

| 21  | 22  | 23  | 36  | 37  | 38  | 39  | 40  | 41  |
|-----|-----|-----|-----|-----|-----|-----|-----|-----|-----|
| 3,3 | 4,3 | 5,3 | 0,6 | 1,6 | 2,6 | 3,6 | 4,6 | 5,6 |
|     |     |     |     |     |     |     |     |     |

A second step of reordering begins so, with, as above described reading of clusters of the second square cluster array, with outputting the first data sample of the clusters, and writing others data samples in the columns of the reordering buffer 8:

de-interleaving memory array 2:

| 0 | 6 | 12 | 18 | 24 | 30 | 36 | 42 | 48 |
|---|---|----|----|----|----|----|----|----|
| 6 | 7 | 8  | 19 | 25 | 31 | 37 | 43 | 49 |
| 12| 13| 14 | 20 | 26 | 32 | 38 | 44 | 50 |
|   |   |    | 21 | 27 | 33 | 39 | 45 | 51 |
|   |   |    | 22 | 28 | 34 | 40 | 46 | 52 |
|   |   |    | 23 | 29 | 35 | 41 | 47 | 53 | output:

3  4  5 reordering buffer 8:

| 9  | 10 | 11 |
|----|----|----|
| 15 | 16 | 17 | and the look-up table 11:

| Log. Ad | 0    | 1    | 2    | 3    | 4    | 5    | 18   | 19   | 20   |
|---------|------|------|------|------|------|------|------|------|------|
| Read    | 0, 0 | 1, 0 | 2, 0 | 3, 0 | 4, 0 | 5, 0 | 0, 3 | 1, 3 | 2, 3 |
| Write   | 0, 0 |      |      |      |      |      |      |      |      |

| 21   | 22   | 23   | 36   | 37   | 38   | 39   | 40   | 41   |
|------|------|------|------|------|------|------|------|------|
| 3, 3 | 4, 3 | 5, 3 | 0, 6 | 1, 6 | 2, 6 | 3, 6 | 4, 6 | 5, 6 |
|      |      |      |      |      |      |      |      |      |

The physical addresses 3,0; 4,0; 5,0 corresponding to the cluster containing the data sample with the respective logical addresses 3; 4; 5 are highlighted in the look-up table 11 above.

The content of the reordering buffer 8 is written in the SQ-1=2 last rows or clusters processed of the current cluster array:

de-interleaving memory array 2:

| 0 | 6 | 12 | 18 | 24 | 30 | 36 | 42 | 48 |
|---|---|----|----|----|----|----|----|----|
| 6 | 7 | 8  | 19 | 25 | 31 | 37 | 43 | 49 |
| 12| 13| 14 | 20 | 26 | 32 | 38 | 44 | 50 |
|   |   |    | 21 | 27 | 33 | 39 | 45 | 51 |
| 4 | 10| 16 | 22 | 28 | 34 | 40 | 46 | 52 |
| 5 | 11| 17 | 23 | 29 | 35 | 41 | 47 | 53 |

The SQ next data samples of the next sequence are stored in the free cluster:

de-interleaving memory array 2:

| 0 | 6 | 12 | 18 | 24 | 30 | 36 | 42 | 48 |
|---|---|----|----|----|----|----|----|----|
| 6 | 7 | 8  | 19 | 25 | 31 | 37 | 43 | 49 |
| 12| 13| 14 | 20 | 26 | 32 | 38 | 44 | 50 |
| 18| 24| 30 | 21 | 27 | 33 | 39 | 45 | 51 |
| 4 | 10| 16 | 22 | 28 | 34 | 40 | 46 | 52 |
| 5 | 11| 17 | 23 | 29 | 35 | 41 | 47 | 53 | and the look-up table 11:

| Log. Ad | 0    | 1    | 2    | 3    | 4    | 5    | 18   | 19   | 20   |
|---------|------|------|------|------|------|------|------|------|------|
| Read    | 0, 0 | 1, 0 | 2, 0 | 3, 0 | 4, 0 | 5, 0 | 0, 3 | 1, 3 | 2, 3 |
| Write   | 0, 0 |      |      |      |      |      | 3, 0 |      |      |

| 21   | 22   | 23   | 36   | 37   | 38   | 39   | 40   | 41   |
|------|------|------|------|------|------|------|------|------|
| 3, 3 | 4, 3 | 5, 3 | 0, 6 | 1, 6 | 2, 6 | 3, 6 | 4, 6 | 5, 6 |
|      |      |      |      |      |      |      |      |      |

These L/SQ=2 reordering steps are followed by L−L/SQ=4 steps without reordering, in each one the following cluster is output in a block, and the free cluster is written with the SQ=3 next data samples of the next sequence:

de-interleaving memory array 2:

| 0  | 6  | 12 | 18 | 24 | 30 | 36 | 42 | 48 |
|----|----|----|----|----|----|----|----|----|
| 36 | 42 | 48 | 19 | 25 | 31 | 37 | 43 | 49 |
| 19 | 25 | 31 | 20 | 26 | 32 | 38 | 44 | 50 |
| 18 | 24 | 30 | 21 | 27 | 33 | 39 | 45 | 51 |
| 1  | 7  | 13 | 22 | 28 | 34 | 40 | 46 | 52 |
| 37 | 43 | 49 | 23 | 29 | 35 | 41 | 47 | 53 | output:

6  7  8  9  10  11  12  13  14  15  16  17 reordering buffer 8:

|   |   |   |
|---|---|---|
|   |   |   | and the look-up table 11:

| Log. Ad | 0    | 1    | 2    | 3    | 4    | 5    | 18   | 19   | 20   |
|---------|------|------|------|------|------|------|------|------|------|
| Read    | 0, 0 | 1, 0 | 2, 0 | 3, 0 | 4, 0 | 5, 0 | 0, 3 | 1, 3 | 2, 3 |
| Write   | 0, 0 | 4, 0 |      |      |      |      | 3, 0 | 2, 0 |      |

-continued

| 21  | 22  | 23  | 36  | 37  | 38  | 39  | 40  | 41  |
|-----|-----|-----|-----|-----|-----|-----|-----|-----|
| 3,3 | 4,3 | 5,3 | 0,6 | 1,6 | 2,6 | 3,6 | 4,6 | 5,6 |
|     |     |     | 1,0 | 5,0 |     |     |     |     |

The method continues in the same way, cluster array by cluster array, until the first sequence has been de-interleaved, and then the next sequence is stored in the de-interleaving memory array 2. Of course, if de-interleaving memory array 2 is completed with padding data, the method is identical, and the padding data are then eliminated.

Furthermore, if the permutation of the reading order of the interleaving memory array is not the identical permutation, the method keeps the same, but clusters of a square cluster array are not consecutive. An example will describe the method according to the invention, similar to the precedent example, but with a permutation of the reading order of the interleaving memory array, which is not the identical permutation.

The number L of rows and the number C of columns of the de-interleaving memory 2 are multiples of the number SQ of rows and columns of the square cluster array. More particularly, in this example, L=L0=6, C=C0=9, and SQ=3.

The interleaved memory array has C0=9 rows and L0=6 columns. It contains the data samples having the logical addresses represented in:

| 0  | 1  | 2  | 3  | 4  | 5  |
|----|----|----|----|----|----|
| 6  | 7  | 8  | 9  | 10 | 11 |
| 12 | 13 | 14 | 15 | 16 | 17 |
| 18 | 19 | 20 | 21 | 22 | 23 |
| 24 | 25 | 26 | 27 | 28 | 29 |
| 30 | 31 | 32 | 33 | 34 | 35 |
| 36 | 37 | 38 | 39 | 40 | 41 |
| 42 | 43 | 44 | 45 | 46 | 47 |
| 48 | 49 | 50 | 51 | 52 | 53 |

A sequence with data samples having logical addresses ordered from 0 to 53 has been written in the interleaving memory array row by row. The interleaving memory array is read column by column, with a permutation on the columns, for example the permutation:

$(L_0, L_1, L_2, L_3, L_4, L_5) \rightarrow (L_0, L_2, L_3, L_1, L_5, L_4)$

The sequence of logical addresses of data samples read on its output is so: 0, 6, 12, 18, 24, 30, 36, 42, 48, 2, 8, 7, 14, 20, 26, 32, 38, 44, 50, 3, 9, 15, 21, 27, 33, 39, 45, 51, 1, 7, 13, 19, 25, 31, 37, 43, 49, 5, 11, 17, 23, 29, 35, 41, 47, 53, 4, 10, 16, 22, 28, 34, 40, 46, 52. This sequence is stored row by row in the de-interleaving memory array, so the de-interleaving memory array 2 contains the data samples having the logical addresses represented in:

de-interleaving memory array 2:

| <u>0</u> | <u>6</u> | <u>12</u> | 18 | 24 | 30 | 36 | 42 | 48 |
|----|----|----|----|----|----|----|----|----|
| <u>2</u> | <u>8</u> | <u>14</u> | 20 | 26 | 32 | 38 | 44 | 50 |
| 3 | 9 | 15 | 21 | 27 | 33 | 39 | 45 | 51 |
| <u>1</u> | <u>7</u> | <u>13</u> | 19 | 25 | 31 | 37 | 43 | 49 |
| 5 | 11 | 17 | 23 | 29 | 35 | 41 | 47 | 53 |
| 4 | 10 | 16 | 22 | 28 | 34 | 40 | 46 | 52 |

In the de-interleaving memory array 2, the first cluster array is represented with logical addresses which are underlined. So, the look-up table 11 contains:

| Log. Ad | 0   | 1   | 2   | 3   | 4   | 5   | 18  | 19  | 20  |
|---------|-----|-----|-----|-----|-----|-----|-----|-----|-----|
| Read    | 0,0 | 3,0 | 1,0 | 2,0 | 5,0 | 4,0 | 0,3 | 3,3 | 1,3 |
| Write   |     |     |     |     |     |     |     |     |     |

| 21  | 22  | 23  | 36  | 37  | 38  | 39  | 40  | 41  |
|-----|-----|-----|-----|-----|-----|-----|-----|-----|
| 2,3 | 5,3 | 4,3 | 0,6 | 3,6 | 1,6 | 2,6 | 5,6 | 4,6 |
|     |     |     |     |     |     |     |     |     |

In the first row are the logical addresses of the data samples of the sequence which are the first of a cluster, and in the second row, the corresponding physical address in the de-interleaving memory array 2. These physical addresses are addresses for reading data samples in the de-interleaving memory array 2. The rows are numbered from 0 to L-1 and columns are numbered from 0 to C-1. In this example L=L0 and C=C0. The size of the square cluster array is SQ=3, as represented above on the de-interleaving memory array 2.

The method begins with considering of the first cluster array, and more particularly, the first cluster of the cluster array, as known, the cluster with the first data sample having the smallest logical address. With this permutation, a cluster array is not formed by successive clusters, for example, the first cluster array comprises logical addresses underlined. This first data sample of the first cluster is output, and other data samples of the cluster are reordered in the reordering buffer 8, written in the first column of the reordering buffer 8. We have:

de-interleaving memory array 2:

|   |   |   | 18 | 24 | 30 | 36 | 42 | 48 |
|----|----|----|----|----|----|----|----|----|
| <u>2</u> | <u>8</u> | <u>14</u> | 20 | 26 | 32 | 38 | 44 | 50 |
| 3 | 9 | 15 | 21 | 27 | 33 | 39 | 45 | 51 |
| <u>1</u> | <u>7</u> | <u>13</u> | 19 | 25 | 31 | 37 | 43 | 49 |
| 5 | 11 | 17 | 23 | 29 | 35 | 41 | 47 | 53 |
| 4 | 10 | 16 | 22 | 28 | 34 | 40 | 46 | 52 | output:

0 reordering buffer 8:

| 6  |  |  |
|----|--|--|
| 12 |  |  | and the look-up table 11:

| Log. Ad | 0   | 1   | 2   | 3   | 4   | 5   | 18  | 19  | 20  |
|---------|-----|-----|-----|-----|-----|-----|-----|-----|-----|
| Read    | 0,0 | 3,0 | 1,0 | 2,0 | 5,0 | 4,0 | 0,3 | 3,3 | 1,3 |
| Write   |     |     |     |     |     |     |     |     |     |

| 21  | 22  | 23  | 36  | 37  | 38  | 39  | 40  | 41  |
|-----|-----|-----|-----|-----|-----|-----|-----|-----|
| 2,3 | 5,3 | 4,3 | 0,6 | 3,6 | 1,6 | 2,6 | 5,6 | 4,6 |
|     |     |     |     |     |     |     |     |     |

The physical address 0,0 corresponding to the cluster containing the data sample with the logical address 0 is highlighted in the look-up table 11 above.

Then the next data sample to be output, with the logical address immediately following the last output, is the data sample of the cluster of the current cluster array, with the first logical address being 1. This is given by the look-up table, as the physical corresponding address, here 3,0. The first data sample of this cluster, having the logical address immediately following the last output, is output, and other data samples of the cluster are reordered in the reordering buffer 8, written in the first column of the reordering buffer 8. We have:

de-interleaving memory array 2:

|   |    |    | 18 | 24 | 30 | 36 | 42 | 48 |
|---|----|----|----|----|----|----|----|----|
| 2 | 8  | 14 | 20 | 26 | 32 | 38 | 44 | 50 |
| 3 | 9  | 15 | 21 | 27 | 33 | 39 | 45 | 51 |
|   |    |    | 19 | 25 | 31 | 37 | 43 | 49 |
| 5 | 11 | 17 | 23 | 29 | 35 | 41 | 47 | 53 |
| 4 | 10 | 16 | 22 | 28 | 34 | 40 | 46 | 52 | output:

0   1 reordering buffer 8:

| 6  | 7  |  |
|----|----|--|
| 12 | 13 |  | and the look-up table 11:

| Log. Ad | 0   | 1   | 2   | 3   | 4   | 5   | 18  | 19  | 20  |
|---------|-----|-----|-----|-----|-----|-----|-----|-----|-----|
| Read    | 0,0 | 3,0 | 1,0 | 2,0 | 5,0 | 4,0 | 0,3 | 3,3 | 1,3 |
| Write   |     |     |     |     |     |     |     |     |     |

| 21  | 22  | 23  | 36  | 37  | 38  | 39  | 40  | 41  |
|-----|-----|-----|-----|-----|-----|-----|-----|-----|
| 2,3 | 5,3 | 4,3 | 0,6 | 3,6 | 1,6 | 2,6 | 5,6 | 4,6 |
|     |     |     |     |     |     |     |     |     |

The physical address 3,0 corresponding to the cluster containing the data sample with the logical address 1 is highlighted in the look-up table 11 above.

Then the next data sample to be output, with the logical address immediately following the last output, is the data sample of the cluster of the current cluster array, with the first logical address being 2. This is given by the look-up table, as the physical corresponding address, here 1,0. The first data sample of this cluster, having the logical address immediately following the last output, is output, and other data samples of the cluster are reordered in the reordering buffer 8, written in the first column of the reordering buffer 8. We have:

de-interleaving memory array 2:

|   |    |    | 18 | 24 | 30 | 36 | 42 | 48 |
|---|----|----|----|----|----|----|----|----|
|   |    |    | 20 | 26 | 32 | 38 | 44 | 50 |
| 3 | 9  | 15 | 21 | 27 | 33 | 39 | 45 | 51 |
|   |    |    | 19 | 25 | 31 | 37 | 43 | 49 |
| 5 | 11 | 17 | 23 | 29 | 35 | 41 | 47 | 53 |
| 4 | 10 | 16 | 22 | 28 | 34 | 40 | 46 | 52 | output:

0   1   2 reordering buffer 8:

| 6  | 7  | 8  |
|----|----|----|
| 12 | 13 | 14 | and the look-up table 11:

| Log. Ad | 0   | 1   | 2   | 3   | 4   | 5   | 18  | 19  | 20  |
|---------|-----|-----|-----|-----|-----|-----|-----|-----|-----|
| Read    | 0,0 | 3,0 | 1,0 | 2,0 | 5,0 | 4,0 | 0,3 | 3,3 | 1,3 |
| Write   |     |     |     |     |     |     |     |     |     |

| 21  | 22  | 23  | 36  | 37  | 38  | 39  | 40  | 41  |
|-----|-----|-----|-----|-----|-----|-----|-----|-----|
| 2,3 | 5,3 | 4,3 | 0,6 | 3,6 | 1,6 | 2,6 | 5,6 | 4,6 |
|     |     |     |     |     |     |     |     |     |

The physical address 1,0 corresponding to the cluster containing the data sample with the logical address 2 is highlighted in the look-up table 11 above.

The reordering buffer 8 is full, so its content is written in the SQ-1=2 last rows or clusters processed of the current cluster array:

de-interleaving memory array 2:

|    |    |    | 18 | 24 | 30 | 36 | 42 | 48 |
|----|----|----|----|----|----|----|----|----|
| 12 | 13 | 14 | 20 | 26 | 32 | 38 | 44 | 50 |
| 3  | 9  | 15 | 21 | 27 | 33 | 39 | 45 | 51 |
| 6  | 7  | 8  | 19 | 25 | 31 | 37 | 43 | 49 |
| 5  | 11 | 17 | 23 | 29 | 35 | 41 | 47 | 53 |
| 4  | 10 | 16 | 22 | 28 | 34 | 40 | 46 | 52 | output:

0    1    2 reordering buffer 8:

|  |  |  |
|--|--|--|
|  |  |  |

The addresses of the SQ-1=2 written reordered cluster are not stored, because with these predetermined parameters (L,C,SQ) their place is known. This has been the first step of reordering. Now a cluster is free in the de-interleaving memory array 2, and the SQ first data samples of the next sequence to be de-interleaved is stored in:

de-interleaving memory array 2:

| 0 | 6 | 12 | 18 | 24 | 30 | 36 | 42 | 48 |
|----|----|----|----|----|----|----|----|----|
| 12 | 13 | 14 | 20 | 26 | 32 | 38 | 44 | 50 |
| 3  | 9  | 15 | 21 | 27 | 33 | 39 | 45 | 51 |
| 6  | 7  | 8  | 19 | 25 | 31 | 37 | 43 | 49 |
| 5  | 11 | 17 | 23 | 29 | 35 | 41 | 47 | 53 |
| 4  | 10 | 16 | 22 | 28 | 34 | 40 | 46 | 52 | output:

0    1    2 reordering buffer 8:

|  |  |  |
|--|--|--|
|  |  |  |

So it is necessary to store in the look-up table the physical address of the first data sample of the cluster corresponding to these data of the next sequence:

look-up table 11:

| Log. Ad | 0   | 1   | 2   | 3   | 4   | 5   | 18  | 19  | 20  |
|---------|-----|-----|-----|-----|-----|-----|-----|-----|-----|
| Read    | 0,0 | 3,0 | 1,0 | 2,0 | 5,0 | 4,0 | 0,3 | 3,3 | 1,3 |
| Write   | 0,0 |     |     |     |     |     |     |     |     |

|         | 21  | 22  | 23  | 36  | 37  | 38  | 39  | 40  | 41  |
|---------|-----|-----|-----|-----|-----|-----|-----|-----|-----|
|         | 2,3 | 5,3 | 4,3 | 0,6 | 3,6 | 1,6 | 2,6 | 5,6 | 4,6 |
|         |     |     |     |     |     |     |     |     |     |

A second step of reordering begins, as above described, for reading clusters of the second square cluster array, with the logical addresses underlined, and with outputting the first data sample of the clusters, and writing others data samples in the columns of the reordering buffer 8:

de-interleaving memory array 2:

| 0 | 6  | 12 | 18 | 24 | 30 | 36 | 42 | 48 |
|---|----|----|----|----|----|----|----|----|
| 12| 13 | 14 | 20 | 26 | 32 | 38 | 44 | 50 |
| 3 | 9 | 15 | 21 | 27 | 33 | 39 | 45 | 51 |
| 6 | 7  | 8  | 19 | 25 | 31 | 37 | 43 | 49 |
| 5 | 11 | 17 | 23 | 29 | 35 | 41 | 47 | 53 |
| 4 | 10 | 16 | 22 | 28 | 34 | 40 | 46 | 52 | and so:

de-interleaving memory array 2:

| 0  | 6  | 12 | 18 | 24 | 30 | 36 | 42 | 48 |
|----|----|----|----|----|----|----|----|----|
| 12 | 13 | 14 | 20 | 26 | 32 | 38 | 44 | 50 |
|    |    |    | 21 | 27 | 33 | 39 | 45 | 51 |
| 6  | 7  | 8  | 19 | 25 | 31 | 37 | 43 | 49 |
|    |    |    | 23 | 29 | 35 | 41 | 47 | 53 |
|    |    |    | 22 | 28 | 34 | 40 | 46 | 52 | output:

3    4    5 reordering buffer 8:

| 9  | 10 | 11 |
|----|----|----|
| 15 | 16 | 17 | and the look-up table 11:

| Log. Ad | 0   | 1   | 2   | 3       | 4       | 5       | 18  | 19  | 20  |
|---------|-----|-----|-----|---------|---------|---------|-----|-----|-----|
| Read    | 0,0 | 3,0 | 1,0 | 2,0 | 5,0 | 4,0 | 0,3 | 3,3 | 1,3 |
| Write   | 0,0 |     |     |         |         |         |     |     |     |

-continued

| 21 | 22 | 23 | 36 | 37 | 38 | 39 | 40 | 41 |
|----|----|----|----|----|----|----|----|----|
| 2,3 | 5,3 | 4,3 | 0,6 | 3,6 | 1,6 | 2,6 | 5,6 | 4,6 |
|    |    |    |    |    |    |    |    |    |

The physical addresses 2,0; 5,0; 4,0 corresponding to the cluster containing the data sample with the logical addresses 3; 4; 5 are highlighted in the look-up table 11 above.

The content of the reordering buffer 8 is written in the SQ−1=2 last rows or clusters processed of the current cluster array:

de-interleaving memory array 2:

| 0  | 6  | 12 | 18 | 24 | 30 | 36 | 42 | 48 |
|----|----|----|----|----|----|----|----|----|
| 12 | 13 | 14 | 20 | 26 | 32 | 38 | 44 | 50 |
|    |    |    | 21 | 27 | 33 | 39 | 45 | 51 |
| 6  | 7  | 8  | 19 | 25 | 31 | 37 | 43 | 49 |
| 15 | 16 | 17 | 23 | 29 | 35 | 41 | 47 | 53 |
| 9 | 10 | 11 | 22 | 28 | 34 | 40 | 46 | 52 |

The SQ next data samples of the next sequence are stored in the free cluster:

de-interleaving memory array 2:

| 0  | 6  | 12 | 18 | 24 | 30 | 36 | 42 | 48 |
|----|----|----|----|----|----|----|----|----|
| 12 | 13 | 14 | 20 | 26 | 32 | 38 | 44 | 50 |
| 18 | 24 | 30 | 21 | 27 | 33 | 39 | 45 | 51 |
| 6  | 7  | 8  | 19 | 25 | 31 | 37 | 43 | 49 |
| 15 | 16 | 17 | 23 | 29 | 35 | 41 | 47 | 53 |
| 9  | 10 | 11 | 22 | 28 | 34 | 40 | 46 | 52 | and the look-up table 11:

| Log. Ad | 0 | 1 | 2 | 3 | 4 | 5 | 18 | 19 | 20 |
|---------|---|---|---|---|---|---|----|----|----|
| Read    | 0,0 | 3,0 | 1,0 | 2,0 | 5,0 | 4,0 | 0,3 | 3,3 | 1,3 |
| Write   | 0,0 |     |     |     |     |     |     | 2,0 |     |

| 21 | 22 | 23 | 36 | 37 | 38 | 39 | 40 | 41 |
|----|----|----|----|----|----|----|----|----|
| 2,3 | 5,3 | 4,3 | 0,6 | 3,6 | 1,6 | 2,6 | 5,6 | 4,6 |
|    |    |    |    |    |    |    |    |    |

These L/SQ=2 reordering steps are followed by L−L/SQ=4 steps without reordering, in each one the following cluster is output in a block, and the free cluster is written with the SQ=3 next data samples of the next sequence:

de-interleaving memory array 2:

| 0  | 6  | 12 | 18 | 24 | 30 | 36 | 42 | 48 |
|----|----|----|----|----|----|----|----|----|
| 19 | 25 | 31 | 20 | 26 | 32 | 38 | 44 | 50 |
| 18 | 24 | 30 | 21 | 27 | 33 | 39 | 45 | 51 |
| 36 | 42 | 48 | 19 | 25 | 31 | 37 | 43 | 49 |
| 37 | 43 | 49 | 23 | 29 | 35 | 41 | 47 | 53 |
| 1  | 7  | 13 | 22 | 28 | 34 | 40 | 46 | 52 | output:

6 7 8 9 10 11 12 13 14 15 16 17 reordering buffer 8:

and the look-up table 11:

| Log. Ad | 0 | 1 | 2 | 3 | 4 | 5 | 18 | 19 | 20 |
|---------|---|---|---|---|---|---|----|----|----|
| Read    | 0,0 | 3,0 | 1,0 | 2,0 | 5,0 | 4,0 | 0,3 | 3,3 | 1,3 |
| Write   | 0,0 | 5,0 |     |     |     |     | 2,0 | 1,0 |     |

| 21 | 22 | 23 | 36 | 37 | 38 | 39 | 40 | 41 |
|----|----|----|----|----|----|----|----|----|
| 2,3 | 5,3 | 4,3 | 0,6 | 3,6 | 1,6 | 2,6 | 5,6 | 4,6 |
|    |    |    | 3,0 | 4,0 |    |    |    |    |

The method continues in the same way, cluster array by cluster array, until the first sequence has been de-interleaved, and then the next sequence is stored in the de-interleaving memory array 2. Of course, if de-interleaving memory array 2 is completed with padding data, the method is identical, and the padding data are than eliminated.

The invention avoids having adaptation buffers which decrease the memory access rate. The invention also allows a high-throughput application while avoiding bottlenecks. Low power is also consumed.

That what is claimed is:

1. A method for de-interleaving successive sequences of interleaved data samples extracted from a virtual memory array having L0 columns and C0 rows, the method comprising:
    receiving each sequence of the interleaved data samples;
    writing row by row the received sequences of interleaved data samples in a de-interleaving memory array having L rows and C columns, with L being greater or equal to L0 and C being greater or equal to C0; and
    de-interleaving the data samples stored in the de-interleaving memory array sub-array by sub-array, with each sub-array being a square cluster array having a number SQ of rows and columns, and with a cluster row being a row of the square cluster array comprising SQ data samples, the number L of rows and the number C of columns of the de-interleaving memory array being multiples of the number SQ of rows and columns, the sub-array de-interleaving comprising for a first group of clusters of a current cluster row, reading each cluster of the first group, outputting a first data sample of the cluster row, and reordering other data samples of the cluster row in a column of a reordering buffer, and writing back the data samples de-interleaved in the reordering buffer into the de-interleaving memory at the last SQ-1 accessed clusters, and for a second group of previously reordered clusters, reading each cluster of the second group, and outputting all data samples of the cluster row.

2. A method according to claim 1, wherein if L0 and C0 are not multiples of SQ, then the writing comprises completing the de-interleaving memory array with padding data to have L rows and C columns, with L and C being multiples of SQ.

3. A method according to claim 1, wherein the square cluster array comprises consecutive clusters along rows of the de-interleaving memory array.

4. A method according to claim 1, wherein the de-interleaving comprises de-interleaving the square cluster array C/SQ times, including L/SQ consecutive processing with reordering of clusters, and L−L/SQ consecutive processing without reordering of clusters.

5. A method according to claim 1, wherein the reordering buffer has SQ-1 rows and SQ columns.

6. A method according to claim 1, wherein a look-up table having three rows and a number of columns equal to C×L/SQ is used, the look-up table containing logical addresses of some of the samples of the current sequence and the corresponding physical addresses in the de-interleaving memory array.

7. A method according to claim 6, wherein:

storing in a first row of the look-up table the logical addresses of the data samples of interleaved data samples of the current sequence stored in the columns of the de-interleaving memory array indexed p(i)+k× SQ, where p(i) specifies intercolumns permutation, with i varying from 0 to L/SQ-1, and k varying from 0 to C/SQ-1;

storing in a second row of the look-up table the physical addresses of the respective logical addresses of the first row; and storing in a third row of the look-up table the physical addresses of data samples of a next sequence of interleaved data samples to be written in the de-interleaving memory array having the respective logical addresses of the first row.

8. A method according to claim 7, wherein the square cluster array de-interleaving further comprises, after having processed a previous cluster, selecting in the square cluster array a next cluster having a first data sample having a logical address immediately following the logical address of a last data sample of the previous cluster.

9. A de-interleaving device of successive sequences of interleaved data samples for a receiving system, the interleaved data samples being extracted from a virtual memory having L0 columns and C0 rows, the de-interleaving device comprising:

a de-interleaving memory array having L rows and C columns, with L being greater or equal to L0 and C being greater or equal to C0;

a receiving circuit for receiving each sequence of the interleaved data samples;

a writing circuit for writing row by row the received sequences of interleaved data samples in said de-interleaving memory array;

a reordering buffer; and a de-interleaving circuit for de-interleaving the data samples stored in said de-interleaving memory array sub-array by sub-array, each sub-array being a square cluster array having a number SQ of rows and columns, with a cluster row being a row of the square cluster array comprising SQ data samples, the number L of rows and the number C of columns of said de-interleaving memory array being multiples of the number SQ of rows and columns, said de-interleaving circuit comprising a first reading circuit for reading each cluster of a first group of clusters of the current cluster row, outputting a first data sample of the cluster row, and reordering other data samples of the cluster row in a column of said reordering buffer, and writing its content back at the SQ-1 last accessed clusters into said de-interleaving memory, and a second reading circuit for reading each cluster of a second group of clusters of the current cluster row, and outputting all data samples from the cluster row.

10. A de-interleaving device according to claim 9, wherein said de-interleaving circuit comprises a completing circuit for completing, if L0 and C0 are not multiples of SQ, said de-interleaving memory array with padding data to have L rows and C columns, with L and C being multiples of SQ.

11. A de-interleaving device according to claim 9, wherein said de-interleaving circuit comprises a defining circuit for defining the square cluster array comprising consecutive clusters.

12. A de-interleaving device according to claim 9, wherein said reordering buffer comprises SQ-1 rows and SQ columns.

13. A de-interleaving device according to claim 9, further comprising a look-up table having three rows and a number of columns equal to C×L/SQ, the look-up table containing logical addresses of some of the data samples of the current sequence and corresponding physical addresses in said de-interleaving memory array.

14. A de-interleaving device according to claim 13, wherein said de-interleaving circuit comprises:

a first storage circuit for storing, in a first row of said look-up table, the logical addresses of the data samples of interleaved data samples of the current sequence stored in the columns of said de-interleaving memory array indexed p(i)+k×SQ, where p(i) specifies the intercolumns permutation, with i varying from 0 to L/SQ-1, and k varying from 0 to C/SQ-1;

a second storage circuit for storing, in a second row of said look-up table, the physical addresses of the respective logical addresses of the first row; and a third storage circuit for storing, in a third row of said look-up table, the physical addresses of data samples of a next sequence of interleaved data samples to be written in said de-interleaving memory array having the respective logical addresses of the first row.

15. A de-interleaving device according to claim 14, wherein said de-interleaving circuit comprises a selection circuit for selecting, after having processed a previous cluster in the square cluster array, a next cluster having a first data sample having a logical address immediately following the logical address of a last data sample of the previous cluster.

16. A de-interleaving device for a receiving system, with interleaved data samples being extracted from a virtual memory having L0 columns and C0 rows, the de-interleaving device comprising:
- a de-interleaving memory array having L rows and C columns, with L being greater or equal to L0 and C being greater or equal to C0;
- a receiving circuit for receiving each sequence of the interleaved data samples;
- a writing circuit for writing row by row the received sequences of interleaved data samples in said de-interleaving memory array; and
- a de-interleaving circuit for de-interleaving the data samples stored in said de-interleaving memory array sub-array by sub-array, each sub-array being a square cluster array having a number SQ of rows and columns, with a cluster row being a row of the square cluster array comprising SQ data samples, the number L of rows and the number C of columns of said de-interleaving memory array being multiples of the number SQ of rows and columns;

said de-interleaving circuit comprising a completing circuit for completing, if L0 and C0 are not multiples of SQ, said de-interleaving memory array with padding data to have L rows and C columns, with L and C being multiples of SQ, the completing based on a look-up table having three rows and a number of columns equal to C×L/SQ, the look-up table containing logical addresses of some of the data samples of the current sequence and corresponding physical addresses in said de-interleaving memory array, said de-interleaving circuit comprising
- a first storage circuit for storing, in a first row of said look-up table, the logical addresses of the data samples of interleaved data samples of the current sequence stored in the columns of said de-interleaving memory array indexed p(i)+k×SQ, where p(1) specifies the intercolumns permutation, with i varying from 0 to L/SQ-1, and k varying from 0 to C/SQ-1,
- a second storage circuit for storing, in a second row of said look-up table, the physical addresses of the respective logical addresses of the first row, and
- a third storage circuit for storing, in a third row of said look-up table, the physical addresses of data samples of a next sequence of interleaved data samples to be written in said de-interleaving memory array having the respective logical addresses of the first row.

17. A de-interleaving device according to claim 16, wherein said de-interleaving circuit further comprises a defining circuit for defining the square cluster array comprising consecutive clusters.

18. A de-interleaving device according to claim 16, further comprising a reordering buffer; and wherein said de-interleaving circuit comprises:
- a first reading circuit for reading each cluster of a first group of clusters of the current cluster row, outputting a first data sample of the cluster row, and reordering other data samples of the cluster row in a column of said reordering buffer, and writing its content back at the SQ-1 last accessed clusters into said de-interleaving memory; and
- a second reading circuit for reading each cluster of a second group of clusters of the current cluster row, and outputting all data samples from the cluster row.

19. A de-interleaving device according to claim 18, wherein said reordering buffer comprises SQ-1 rows and SQ columns.

20. A de-interleaving device according to claim 16, wherein said de-interleaving circuit comprises a selection circuit for selecting, after having processed a previous cluster in the square cluster array, a next cluster having a first data sample having a logical address immediately following the logical address of a last data sample of the previous cluster.

21. A cellular mobile phone comprising:
- a radio frequency (RF) stage for receiving interlaced data samples; and
- a de-interleaving device connected to said RF stage for processing successive sequences of the received interleaved data samples, the interleaved data samples being extracted from a virtual memory having L0 columns and C0 rows, said de-interleaving device comprising
  - a de-interleaving memory array having L rows and C columns, with L being greater or equal to L0 and C being greater or equal to C0,
  - a receiving circuit for receiving each sequence of the interleaved data samples,
  - a writing circuit for writing row by row the received sequences of the interleaved data samples in said de-interleaving memory array,
  - a reordering buffer, and
  - a de-interleaving circuit for de-interleaving the data samples stored in said de-interleaving memory array sub-array by sub-array, each sub-array being a square cluster array having a number SQ of rows and columns, with a cluster row being a row of the square cluster array comprising SQ data samples, the number L of rows and the number C of columns of said de-interleaving memory array being multiples of the number SQ of rows and columns, said de-interleaving circuit comprising
    - a first reading circuit for reading each cluster of a first group of clusters of the current cluster row, outputting a first data sample of the cluster row, and reordering other data samples of the cluster in a column of said reordering buffer, and writing its content back at the SQ-1 last accessed clusters into said de-interleaving memory; and
    - a second reading circuit for reading each cluster of a second group of clusters of the current cluster row, and outputting all data samples from the cluster row.

22. A cellular mobile phone according to claim 21, wherein said de-interleaving circuit comprises a completing circuit for completing, if L0 and C0 are not multiples of SQ, said de-interleaving memory array with padding data to have L rows and C columns, with L and C being multiples of SQ.

23. A cellular mobile phone according to claim 21, wherein said de-interleaving circuit comprises a defining circuit for defining the square cluster array comprising consecutive clusters.

24. A cellular mobile phone according to claim 21, wherein said reordering buffer comprises SQ-1 rows and SQ columns.

25. A cellular mobile phone according to claim 21, wherein said de-interleaving device further comprises a look-up table having three rows and a number of columns equal to C×L/SQ, the look-up table containing logical addresses of some of the data samples of the current sequence and corresponding physical addresses in said de-interleaving memory array.

26. A cellular mobile phone according to claim 25, wherein said de-interleaving circuit comprises:
- a first storage circuit for storing, in a first row of said look-up table, the logical addresses of the data samples of interleaved data samples of the current sequence stored in the columns of said de-interleaving memory array indexed $p(i)+k \times SQ$, where $p(i)$ specifies the inter-columns permutation, with i varying from 0 to $L/SQ-1$, and k varying from 0 to $C/SQ-1$;
- a second storage circuit for storing, in a second row of said look-up table, the physical addresses of the respective logical addresses of the first row; and
- a third storage circuit for storing, in a third row of said look-up table, the physical addresses of data samples of a next sequence of interleaved data samples to be written in said de-interleaving memory array having the respective logical addresses of the first row.

27. A cellular mobile phone according to claim 26, wherein said de-interleaving circuit comprises a selection circuit for selecting, after having processed a previous cluster in the square cluster array, a next cluster having a first data sample having a logical address immediately following the logical address of a last data sample of the previous cluster.

* * * * *